(12) United States Patent
Nam et al.

(10) Patent No.: US 7,785,951 B2
(45) Date of Patent: Aug. 31, 2010

(54) METHODS OF FORMING INTEGRATED CIRCUIT DEVICES HAVING TENSILE AND COMPRESSIVE STRESS LAYERS THEREIN AND DEVICES FORMED THEREBY

(75) Inventors: Seo-woo Nam, Gyeonggi-do (KR); Il-young Yoon, Gyeonggi-do (KR); Jae-ouk Choo, Gyeonggi-do (KR); Hong-jae Shin, Seoul (KR); Nae-in Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 11/831,223

(22) Filed: Jul. 31, 2007

(65) Prior Publication Data
US 2008/0081476 A1 Apr. 3, 2008

(30) Foreign Application Priority Data
Sep. 28, 2006 (KR) .................. 10-2006-0095113

(51) Int. Cl.
*H01L 21/8238* (2006.01)
(52) U.S. Cl. ................... 438/199; 257/E21.24
(58) Field of Classification Search ........... 438/199, 438/216, 287
See application file for complete search history.

(56) References Cited

U.S. PATENT DOCUMENTS

| | | | |
|---|---|---|---|
| 5,731,617 A | 3/1998 | Suda | |
| 6,184,157 B1 | 2/2001 | Hsu et al. | |
| 6,372,589 B1 | 4/2002 | Yu | |
| 6,869,866 B1 | 3/2005 | Chidambarrao et al. | |
| 7,022,561 B2 | 4/2006 | Huang et al. | |
| 7,052,946 B2 | 5/2006 | Chen et al. | |

(Continued)

FOREIGN PATENT DOCUMENTS

JP  06-163578  6/1994

(Continued)

OTHER PUBLICATIONS

U.S. Appl. No. 11/874,118, filed Oct. 17, 2007, Kim et al.

(Continued)

*Primary Examiner*—W. David Coleman
*Assistant Examiner*—Christine Enad
(74) *Attorney, Agent, or Firm*—Myers Bigel Sibley & Sajovec

(57) ABSTRACT

Methods of forming integrated circuit devices include forming first, second and third gate electrodes on a semiconductor substrate. A first stress film is provided that covers the first gate electrode and at least a first portion of the third gate electrode. The first stress film has a sufficiently high internal stress characteristic to impart a net compressive stress in a first portion of the semiconductor substrate extending opposite the first gate electrode. A second stress film is also provided. The second stress film covers the second gate electrode and at least a second portion of the third gate electrode. The second stress film has a sufficiently high internal stress characteristic to impart a net tensile stress in a second portion of the semiconductor substrate extending opposite the second gate electrode. The second stress film has an upper surface that is coplanar with an upper surface of the first stress film at a location adjacent the third gate electrode.

17 Claims, 11 Drawing Sheets

U.S. PATENT DOCUMENTS

| | | |
|---|---|---|
| 7,189,624 B2 | 3/2007 | Ito |
| 7,297,584 B2 | 11/2007 | Park et al. |
| 7,396,718 B2 | 7/2008 | Frohberg et al. |
| 7,482,215 B2 * | 1/2009 | Dyer et al. ............... 438/199 |
| 7,534,678 B2 | 5/2009 | Lee et al. |
| 2003/0040158 A1 | 2/2003 | Saitoh |
| 2004/0021160 A1 * | 2/2004 | Eguchi et al. ............ 257/296 |
| 2005/0048732 A1 | 3/2005 | Park et al. |
| 2005/0093078 A1 | 5/2005 | Chan et al. |
| 2005/0098829 A1 | 5/2005 | Doris et al. |
| 2005/0199963 A1 | 9/2005 | Aoyama |
| 2005/0218455 A1 | 10/2005 | Maeda et al. |
| 2005/0230756 A1 | 10/2005 | Chang et al. |
| 2006/0011586 A1 | 1/2006 | Shea |
| 2006/0019438 A1 | 1/2006 | Harakawa |
| 2006/0046400 A1 | 3/2006 | Burbach et al. |
| 2006/0094193 A1 | 5/2006 | Horstmann et al. |
| 2006/0118879 A1 | 6/2006 | Li |
| 2007/0099360 A1 * | 5/2007 | Lee et al. ............... 438/197 |
| 2007/0252230 A1 * | 11/2007 | Zhu et al. ............... 257/499 |
| 2007/0257336 A1 | 11/2007 | Matsumoto |
| 2008/0026523 A1 * | 1/2008 | Lee et al. ............... 438/231 |
| 2008/0050869 A1 * | 2/2008 | Sudo ....................... 438/228 |
| 2008/0073713 A1 | 3/2008 | Kim et al. |
| 2009/0101945 A1 | 4/2009 | Yamaguchi et al. |

FOREIGN PATENT DOCUMENTS

| | | |
|---|---|---|
| JP | 10-177938 | 6/1998 |
| JP | 2001-352055 | 12/2001 |
| JP | 2003-060076 | 2/2003 |
| JP | 2003086704 | 3/2003 |
| JP | 2003-273240 | 9/2003 |
| JP | 2003273240 | 9/2003 |
| JP | 2004047608 | 2/2004 |
| JP | 2004128316 | 4/2004 |
| JP | 2005-064314 | 3/2005 |
| JP | 2006080161 | 3/2006 |
| JP | 2006-173432 A | 6/2006 |
| JP | 2006-237070 A | 9/2006 |
| KR | 10-1997-0018691 | 4/1997 |
| KR | 100183785 | 12/1998 |
| KR | 10-2001-0076522 A | 8/2001 |
| KR | 1020020017845 A | 3/2002 |
| KR | 1020020074551 A | 10/2002 |
| KR | 1020030076354 A | 9/2003 |
| KR | 1020040070794 A | 6/2004 |
| KR | 10-2004-0107477 | 12/2004 |
| KR | 1020050049243 A | 5/2005 |
| KR | 1020060000912 A | 1/2006 |
| KR | 1020060004595 A | 1/2006 |
| KR | 1020060119773 A | 11/2006 |

OTHER PUBLICATIONS

U.S. Appl. No. 11/691,691, filed Mar. 27, 2007.
U.S. Appl. No. 11/691,691, filed Mar. 27, 2007, Lee et al.
U.S. Appl. No. 11/831,223, filed Jul. 31, 2007, Nam et al.

* cited by examiner

METHODS OF FORMING INTEGRATED CIRCUIT DEVICES HAVING TENSILE AND COMPRESSIVE STRESS LAYERS THEREIN AND DEVICES FORMED THEREBY

CROSS-REFERENCE TO RELATED APPLICATION

This application is related to U.S. application Ser. No. 11/691,691, filed Mar. 27, 2007, the disclosure of which is hereby incorporated herein by reference.

REFERENCE TO PRIORITY APPLICATION

This application claims priority from Korean Patent Application No. 10-2006-0095113, filed Sep. 28, 2006, the disclosure of which is hereby incorporated herein by reference.

FIELD OF THE INVENTION

The present invention relates to semiconductor devices and methods of fabricating the same and, more particularly, to semiconductor devices having stress layers therein and methods of fabricating the same.

BACKGROUND OF THE INVENTION

Due to high integration and high speed of metal oxide semiconductor field effect transistors (MOSFET), various processes have been studied to form transistors that do not generate errors and have excellent performance. Particularly, many processes are developed to increase mobility of electrons or holes in order to produce high-performance transistors.

A process of applying physical stress to a channel area to change an energy band structure of the channel area may be performed to increase the mobility of the electrons or the holes. For example, NMOS transistors have improved performance in the case of when tensile stress is applied to a channel, and PMOS transistors have improved performance in the case of when compressive stress is applied to a channel. Accordingly, a dual stress film structure where a tensile stress film is formed on the NMOS transistor and a compressive stress film is formed on the PMOS transistor to improve performances of both the NMOS transistor and the PMOS transistor has been studied.

However, in the case of when the dual stress film is applied, an area where the tensile stress film and the compressive stress film partially overlap may be formed at the interface of the NMOS transistor and the PMOS transistor according to characteristics of devices or photolithography margins. The overlapping area of the stress film is thicker than the area where the single stress film is layered. Therefore, in the case where contact holes are formed through the single stress film and the overlapping area using an etching process, the contact holes are first formed through the single stress film, and a lower stricture of the contact holes which are formed beforehand may be attacked before the contact holes are formed through the overlapping area. Accordingly, contact characteristics and reliability of the semiconductor device may be reduced.

SUMMARY OF THE INVENTION

A semiconductor device according to embodiments of the invention includes a semiconductor substrate, a first stress film covering a first gate electrode and first source/drain areas of a first transistor area and extended to a third gate electrode of an interface area, a second stress film covering a second gate electrode and second source/drain areas of a second transistor area and extended to the third gate electrode of the interface area, and an interlayer insulating film formed on the second stress film. The semiconductor substrate includes the first transistor area having the first gate electrode and the first source/drain areas, the second transistor area having the second gate electrode and the second source/drain areas, and the interface area provided at an interface between the first transistor area and the second transistor area and having the third gate electrode. The third gate electrode is covered by at least one of the first stress film and the second stress film, and uppermost sides of the first stress film and the second stress film provided on upper sides of the first gate electrode, the second gate electrode, and the third gate electrode have the same level based on the semiconductor substrate.

Additional embodiments of the invention include a method of fabricating a semiconductor device. The method includes forming a first stress film covering a first gate electrode and first source/drain areas of a first transistor area of a semiconductor substrate, and at least a portion of a third gate electrode of an interface area between the first transistor area and a second transistor area. A second stress film is also formed. The second stress film covers a second gate electrode and second source/drain areas of the second transistor area of the semiconductor substrate and overlaps at least a portion of the first stress film on the third gate electrode of the interface area. A first interlayer insulating film is formed on the semiconductor substrate. The first interlayer insulating film is then planarized by CMP to expose upper sides of the first stress film on the first gate electrode, the second stress film on the second gate electrode, and the first stress film on the third gate electrode.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Figure 1:
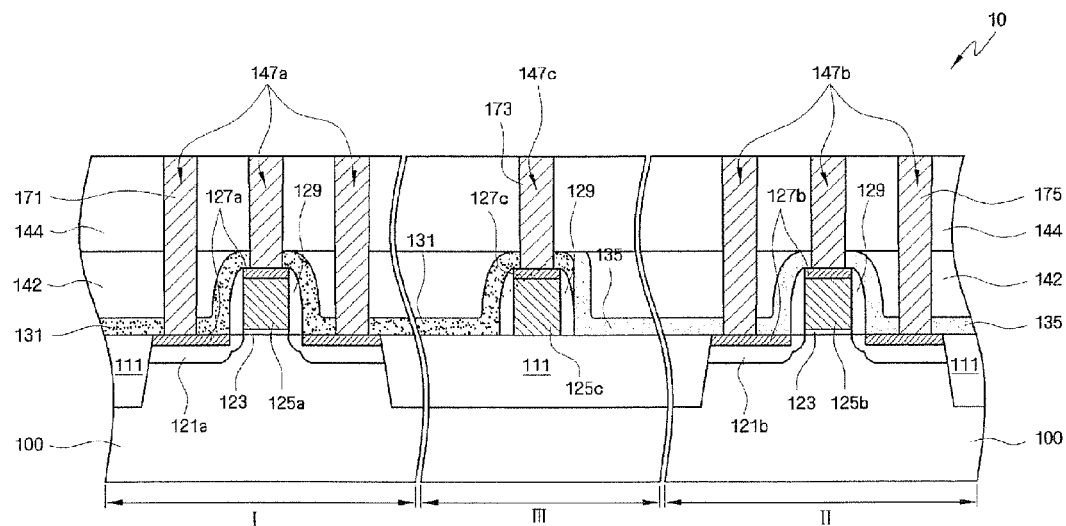
FIG. 1 is a sectional view of a semiconductor device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art.

The terminology used herein is for the purpose of describing particular embodiments and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated elements, steps, operations, and/or components, but do not preclude the presence or addition of one or more other elements, steps, operations, and/or components. Additionally, the term "and/or" includes any and all combinations of one or more of the associated listed items. Furthermore, like numbers refer to like elements throughout.

The present invention will be described with reference to cross-sectional views and/or schematic views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in the manufacturing processes. For the convenience of description, constituent elements in the drawings of the present invention can be slightly enlarged or reduced.

FIG. 1 is a sectional view of a semiconductor device according to a first embodiment of the present invention. With reference to FIG. 1, a semiconductor device 10 includes a plurality of transistors that are formed on the semiconductor substrate 100. The semiconductor substrate 100 may be divided into at least three areas, for example, an NMOS transistor area (I), a PMOS transistor area (II), and an interface area (III). The semiconductor substrate 100 may be made of, for example, Si, Ge, SiGe, GaP, GaAs, SiC, SiGeC, InAs, InP, or a mixture thereof. Moreover, the semiconductor substrate 100 may be a laminated substrate where at least two layers including a semiconductor substance layer formed of the above-mentioned substances and an insulating layer are layered. Examples of the semiconductor substrate may include an SOI (Silicon On Insulator) substrate. An element isolation film 111 that defines an active area is formed in the semiconductor substrate 100. Furthermore, a P-type well may be formed in the semiconductor substrate 100 of the NMOS transistor area (I) and a N-type well may be formed in the semiconductor substrate 100 of the PMOS transistor area (II), which are not shown.

The NMOS transistor which is formed in the NMOS transistor area (I) and the PMOS transistor which is formed in the PMOS transistor area (II) include gate electrodes 125a and 125b formed on the semiconductor substrate 100 so that gate insulating films 123 are interposed between the gate electrodes and the semiconductor substrate, source/drain areas 121a and 121b formed in the semiconductor substrate 100 so that the source/drain areas face each other while the gate electrodes 125a and 125b are provided between the source/drain areas, and channel areas which are provided between the source/drain areas 121a and 121b and overlap lower portions of the gate electrodes 125a and 125b.

The gate electrodes 125a and 125b may be a single film formed of, for example, a polysilicon film, a metal film, or a metal silicide film, or a laminated film thereof. In the polysilicon film, for example, the N-type impurity is doped into the NMOS transistor area (I) and the P-type impurity is doped into the PMOS transistor area (II). However, the polysilicon film is not limited to the above-mentioned structure. The conductivity types of impurities doped into the areas of the polysilicon film may be reversed as compared to the above-mentioned structure, or the areas may have the same conductivity type. Examples of metal components constituting the metal film or the silicide film may include tungsten (W), cobalt (Co), nickel (Ni), titanium (Ti), and tantalum (Ta). However, hereinafter, only a description of the gate electrodes 125a and 125b that include the polysilicon film and the silicide films 127a and 127b formed on the polysilicon film will be given.

The gate insulating films 123 are interposed between the semiconductor substrate 100 and the gate electrodes 125a and 125b. The gate insulating films 123 may be formed of, for example, a silicon oxide film. However, a film constituting the gate insulating film is not limited to the silicon oxide film, but another high dielectric insulating film or a low dielectric insulating film may be used.

Spacers 129 are formed on sidewalls of the gate electrodes 125a and 125b and the gate insulating films 123. The spacers may be formed of, for example, a silicon nitride film. The source/drain areas 121a and 121b include an LDD (light doped drain) area that overlaps the spacers 129 and a high-concentration doping area that does not overlap the spacers 129. In the NMOS transistor area (I), the N-type impurity is doped into the LDD area at a low concentration, and the N-type impurity is doped into the high-concentration doping area at a high concentration. In the PMOS transistor area (II), the P-type impurity is doped into the LDD area at a low concentration, and the P-type impurity is doped into the high-concentration doping area at a high concentration. In the modified embodiment of the present invention, which is not shown, a DDD (double diffused drain) area may be provided instead of the LDD area.

The source/drain areas 121a and 121b may include the silicide films 127a and 127b that are identical or similar to the silicide films formed on upper parts of the gate electrodes 125a and 125b. In the specification, the silicide films 127a and 127b are divided for the convenience of description. That is, the silicide films 127a and 127b included in the source/drain areas 121a and 121b and the silicide films 127a and 127b included in the gate electrodes 125a and 125b are designated by the same reference numeral if they are provided in the same area. However, substances constituting the films may be different from each other.

Meanwhile, a gate electrode 125c and a spacer 129 that have substantially the same stricture as those of the NMOS transistor area (I) and the PMOS transistor area (II) are formed in the interface area (III). Accordingly, an upper part of the gate electrode 125c of the interface area (III) may include a silicide film 127c. The gate electrode 125c of the interface area (III) may be formed on the element isolation film 111. In this case, as shown in FIG. 1, the gate insulating film 123 may be omitted. Meanwhile, in the present embodiment, the gate electrode 125c of the interface area (III) may be formed on the active area. In this case, the gate electrode 125c may constitute a portion of the NMOS transistor or the PMOS transistor.

A first stress film 131 and/or a second stress film 135 are formed on the above-mentioned gate electrodes 125a, 125b, and 125c of the NMOS transistor area (I), the PMOS transistor area (II), and the interface area (III). In detail, the first stress film 131 having an internal tensile stress is formed in the NMOS transistor area (I), and the second stress film 135 having an internal compressive stress is formed in the PMOS transistor area (II). The first stress film 131 and the second stress film 135 may be formed of, for example, SiN, SiON, SiBN, SiC, SiC:H, SiCOH, SiCN, SiO$_2$, or a combination thereof, and may have a thickness in the range of 1 to 1,000 Å. Preferably, the first stress film 131 and the second stress film 135 may be substantially the same as each other in terms of thickness.

The stress of the first stress film 131 and the second stress film 135 may be controlled depending on a composition ratio of substances constituting the films or a formation condition of the substances. For example, the first stress film 131 may have tensile stress of 0.01 to 5 GPa, and the second stress film 135 may have compressive stress of −0.01 to −5 GPa. The first stress film 131 and the second stress film 135 apply stress to the channel area so as to increase mobility of carriers. That is, the first stress film 131 covers the gate electrode 125a and the source/drain areas 121a of the NMOS transistor to apply tensile stress to the channel area, thereby increasing the mobility of electron carriers therein. The second stress film 135 covers the gate electrode 125b and the source/drain areas 121b of the PMOS transistor to apply compressive stress to the channel area, thereby increasing the mobility of the hole carriers therein.

As illustrated, the first stress film 131 and the second stress film 135 meet each other in the interface area (III). The area where the first stress film 131 and the second stress film 135 partially overlap may be included in the interface area according to the process margin. However, the thickness of the stress film layered on the upper side of the gate electrode 125c of the interface area (III) may be substantially the same as the thickness of the first stress film 131 provided on the upper side of the gate electrode 125a of the NMOS transistor area (I) or the thickness of the second stress film 135 provided on the upper side of the gate electrode 125b of the PMOS transistor area (II). For example, FIG. 1 shows the case of where the first stress film 131 is layered on the upper side of the gate electrode 125c of the interface area (III) and the second stress film 135 does not overlap the first stress film.

The modified embodiment that is not shown and different from the embodiment of FIG. 1 may be feasible. For example, the second stress film 135 may be layered on the upper side of the gate electrode 125c of the interface area (III). In another modified embodiment, both the first stress film 131 and the second stress film 135 may be provided on the upper side of the gate electrode 125c and share the interface while the first stress film and the second stress film do not overlap. In another modified embodiment, both the first stress film 131 and the second stress film 135 are provided on the upper side of the gate electrode 125c and partially overlap each other. However, in the overlapping area, since the total thickness of the first stress film 131 and the second stress film 135 is smaller as compared to those of the other areas, the total thickness of the first stress film 131 and the second stress film 135 in the overlapping area may be substantially the same as the thickness of the first stress film 131 provided on the upper side of the gate electrode 125a of the NMOS transistor area (I), or the thickness of the second stress film 135 provided on the upper side of the gate electrode 125b of the PMOS transistor area (II).

The total area of the first stress film 131 and the second stress film 135 which are provided on the upper sides of the gate electrodes 125a, 125b, and 125c of the NMOS transistor area (I), the PMOS transistor area (II), and the interface area (III) and have the same level may be, for example, 10 to 50% of the whole area of the semiconductor substrate 100. In connection with this, the term "level" means the height from the semiconductor substrate 100. Additionally, the phrase "the total area of the first stress film 131 and the second stress film 135 which are provided on the upper sides of the gate electrodes 125a, 125b, and 125c and have the same level" means the sum total of areas of uppermost surfaces of the first stress film 131 and the second stress film 135.

In this case, the total area of the first stress film 131 and the second stress film 135 which are provided on the upper side of the gate electrode 125c of the interface area (III) and have the same level may be less than 10% of the whole area of the semiconductor substrate 100. However, the present embodiment is not limited to the above-mentioned area ratio.

A first interlayer insulating film 142 and a second interlayer insulating film 144 are formed on the first stress film 131 and the second stress film 135. An upper side of the first interlayer insulating film 142, that is, the interface between the first interlayer insulating film 142 and the second interlayer insulating film 144, is flat, and has the same level as the highest side of the upper sides of the first stress film 131 or the second stress film 135 provided on the upper sides of the gate electrodes 125a, 125b, and 125c.

The first interlayer insulating film 142 and the second interlayer insulating film 144 may be formed of, for example, TEOS (tetra ethyl ortho silicate), O$_3$-TEOS, USG (undoped silicate glass), PSG (phosphosilicate glass), BSG (borosilicate glass), BPSG (borophosphosilicate glass), FSG (fluoride silicate glass), SOG (spin on glass), TOSZ (tonen silazene), or a combination thereof. The first interlayer insulating film 142 and the second interlayer insulating film 144 may be made of different substances or the same substance.

Contact holes 147a, 147b, and 147c are formed on the gate electrodes 125a, 125b, and 125c and the source/drain areas 121a and 121b to expose the gate electrodes and the source/drain areas. The contact holes 147a, 147b, and 147c are formed through the second interlayer insulating film 144, the first interlayer insulating film 142, and the first stress film 131 or the second stress film 135. However, the contact holes 147a, 147b, and 147c through which the gate electrodes 125a, 125b, and 125c are exposed are formed only through the second interlayer insulating film 144 and the first stress film 131 or the second stress film 135 while the contact holes are not formed through the first interlayer insulating film 142.

Contact plugs 171, 173, and 175 are put into the contact holes 147a, 147b, and 147c. The contact plugs 171, 173, and 175 are electrically connected to the gate electrodes 125a, 125b, and 125c or the source/drain areas 121a and 121b. The contact plugs 171, 173, and 175 may be made of a metal substance such as W, Cu, or Al, or a conductive substance such as conductive polysilicon.

Hereinafter, other embodiments of the present invention will be described. In the following embodiments, a description may be omitted or briefly given of the same structure as the former embodiment, and a difference in constitution will be mainly described.

Figure 2:
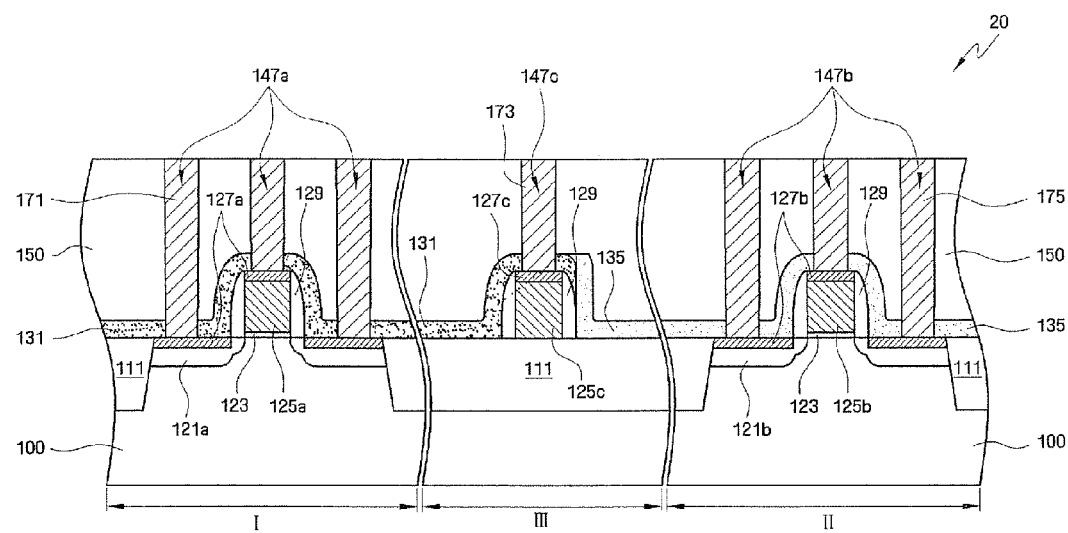
FIG. 2 is a sectional view of a semiconductor device according to another embodiment of the present invention.
Figure 3:
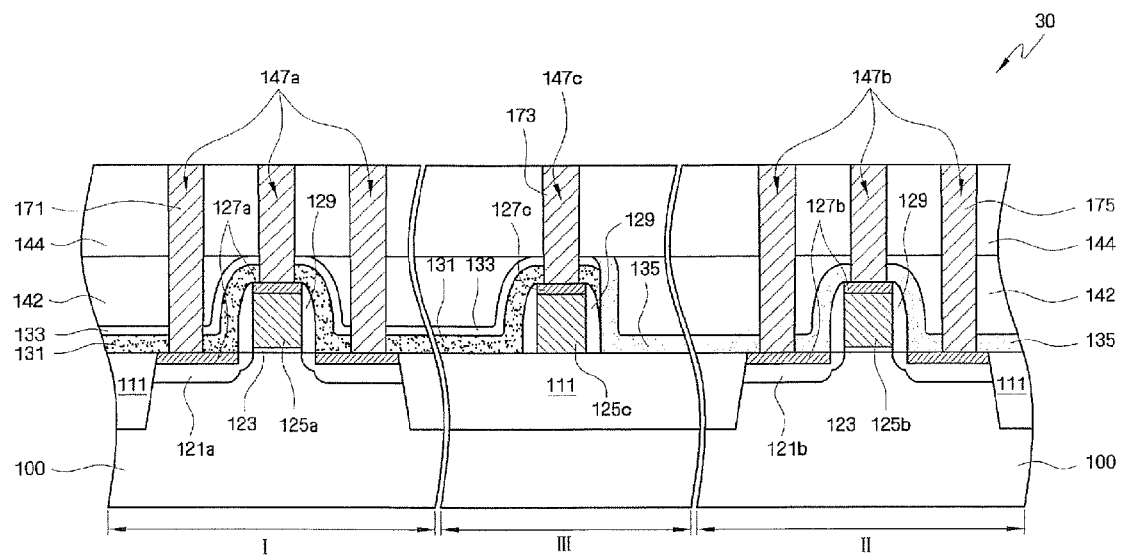
FIG. 3 is a sectional view of a semiconductor device according to another embodiment of the present invention.

FIG. 2 is a sectional view of a semiconductor device according to a second embodiment of the present invention. With reference to FIG. 2, a semiconductor device 20 according to the present embodiment is different from that of the embodiment shown in FIG. 1 in that a third interlayer insulating film 150 forms a single body while the film is not divided. The substance constituting the third interlayer insulating film 150 is substantially the same as that of the first interlayer insulating film or the second interlayer insulating film of FIG. 1. FIG. 3 is a sectional view of a semiconductor device according to a third embodiment of the present invention. With reference to FIG. 3, a semiconductor device 30 according to the present embodiment is different from that of the embodiment shown in FIG. 1 in that an etch stop film 133 is further formed on the first stress film 131. Additionally, the semiconductor device 30 according to the present embodiment is different from that of the embodiment of FIG. 1 in that the total area of the first stress film 131 and the second stress film 135 provided on the upper sides of gate electrodes 125*a* and 125*c* of the NMOS transistor area (I) and the interface area (III) other than the PMOS transistor area (II) is 10 to 50% of the whole area of the semiconductor substrate 100.

In detail, the etch stop film 133 is formed on the first stress film 131 of the NMOS transistor area (I) and the interface area (II). The etch stop film 133 may be formed of a silicon oxide film, or a LTO (low temperature oxide) film. An upper side of the first interlayer insulating film 142, that is, the interface between the first interlayer insulating film 142 and the second interlayer insulating film 144, has the same level as the highest portion of the upper side of the etch stop film 133 which overlaps the gate electrodes 125*a* and 125*c* of the NMOS transistor area (I) and the interface area (III).

Meanwhile, in the case of when the first stress film 131 and the second stress film 135 are formed to have the same thickness and the upper side of the first interlayer insulating film 142 is made flat, the upper side of the second stress film 135 that is provided on the gate electrode 125*b* of the PMOS transistor area (II) is lower than the upper side of the first interlayer insulating film 142. In detail, the upper side of the second stress film 135 has the level lower than that of the upper side of the first interlayer insulating film 142 by the thickness ranging from the upper side of the first interlayer insulating film 142 to the etch stop film 133 provided on the gate electrodes 125*a* and 125*c*.

The above-mentioned structure is different from that of the embodiment shown in FIG. 1 in view of contact holes 147*a*, 147*b*, and 147*c*. That is, the contact holes 147*a* and 147*c* that are formed in the NMOS transistor area (I) and the interface area (III) are formed through the etch stop film 133 unlike the embodiment of FIG. 1. In addition, the contact hole 147*b* of the PMOS transistor area (II) is the same as the structure of FIG. 1 in the case of when the source/drain areas 121*b* are exposed. However, in the case of when the gate electrode 125*b* is exposed, the contact hole is formed through the first interlayer insulating film 142.

Figure 4:
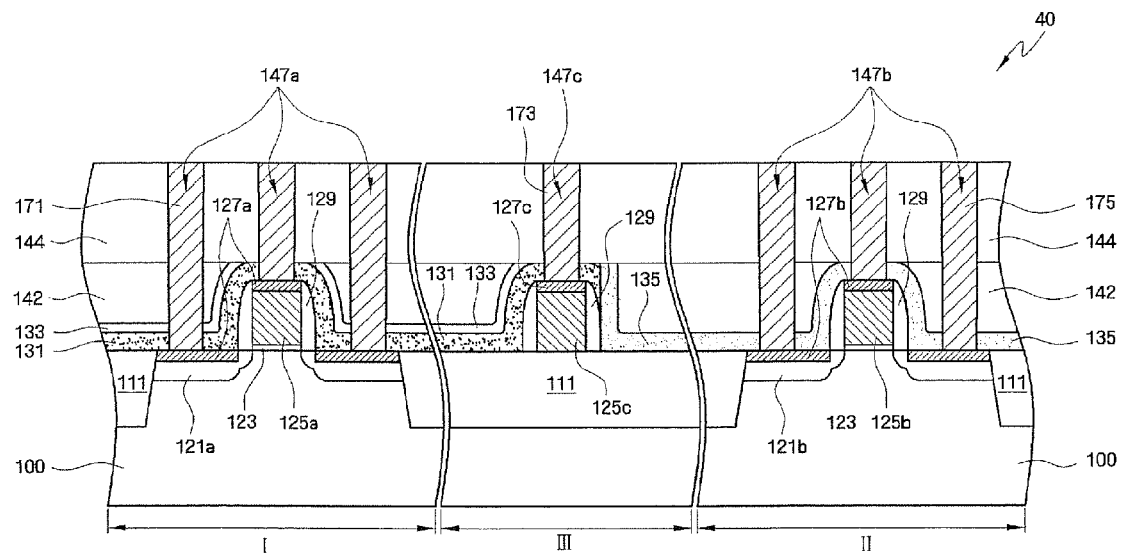
FIG. 4 is a sectional view of a semiconductor device according to another embodiment of the present invention.

FIG. 4 is a sectional view of a semiconductor device according to a fourth embodiment of the present invention. With reference to FIG. 4, a semiconductor device 40 according to the present embodiment is different from that of the embodiment of FIG. 3 in that the interface between a first interlayer insulating film 142 and a second interlayer insulating film 144 has the same level as a second stress film 135. Furthermore, in comparison with the embodiment of FIG. 3, the etch stop film 133 on the first stress film 131 which is provided on the gate electrodes 125*a* and 125*c* in the NMOS transistor area (I) and the interface area (III) is removed. Therefore, the interface between the first interlayer insulating film 142 and the second interlayer insulating film 144 has the same level as the upper side of the first stress film 131 on the gate electrodes 125*a* and 125*c* of the NMOS transistor area (I) and the interface area (III).

Through the above-mentioned structure, it can be seen that the contact holes 147*a* and 147*c* through which the gate electrodes 125*a* and 125*c* of the NMOS transistor area (I) and the interface area (III) are exposed are not formed through the etch stop film 133 unlike in the embodiment of FIG. 3, and the contact hole 147*b* formed through the gate electrode 125*b* of the PMOS transistor area (II) is not formed through the first interlayer insulating film 142.

Meanwhile, in the embodiments of FIGS. 3 and 4, the case of when the interlayer insulating film is divided into the first interlayer insulating film and the second interlayer insulating film is disclosed. However, in the above-mentioned embodiments, the interlayer insulating film may be formed of the single third interlayer insulating film like the embodiment of FIG. 2.

Figure 5:
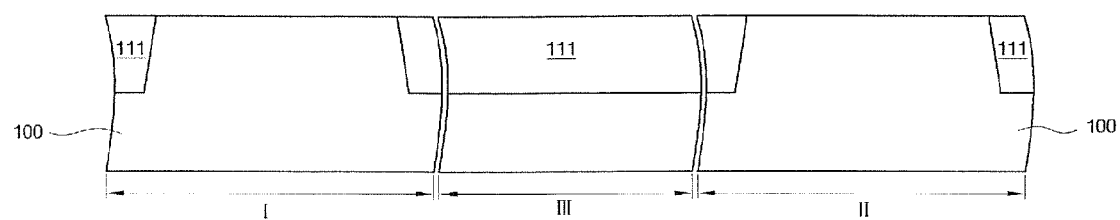
FIGS. 5 to 20 are sectional views illustrating methods of the fabricating semiconductor devices according to embodiments of the present invention shown in FIG. 1.

FIGS. 5 to 20 are sectional views of intermediate structures that illustrate methods of fabricating the semiconductor device according to the first embodiment of the present invention shown in FIG. 1. With reference to FIG. 5, the semiconductor substrate 100 is divided into the NMOS transistor area (I), the PMOS transistor area (II), and the interface area (III), and the element isolation films 111 are formed in the areas to define active areas. The element isolation films 111 may be formed of, for example, a silicon oxide film, and the formation may be performed using a LOCOS (local oxidation of silicon) process or a STI (shallow trench isolation) process. Since various types of methods of forming the element isolation films 111 are known to those who skilled in the art, a detailed description thereof will be omitted.

Meanwhile, the sectional view of FIG. 5 shows the formation of only the element isolation film 111 in the interface area (III). Needless to say, however, only the active area may be formed in the interface area (III), or both the element isolation film 111 and the active area may be formed in the interface area (III). Additionally, before or after the element isolation films 111 are formed, the NMOS transistor area (I) of the semiconductor substrate 100 may include the p-type impurity doped at a low concentration, and the PMOS transistor area (II) of the semiconductor substrate 100 may include the n-type impurity doped at a low concentration, which are not shown. For example, in the case of when a P-type substrate is used as the semiconductor substrate 100, the n-type impurity may be doped into the PMOS transistor area (II) to form an n-well. In the case of when the P-type substrate is used as the base substrate, the p-type impurity may be doped into the NMOS transistor area (I) to form a p-well, but this is not necessary.

Figure 6:
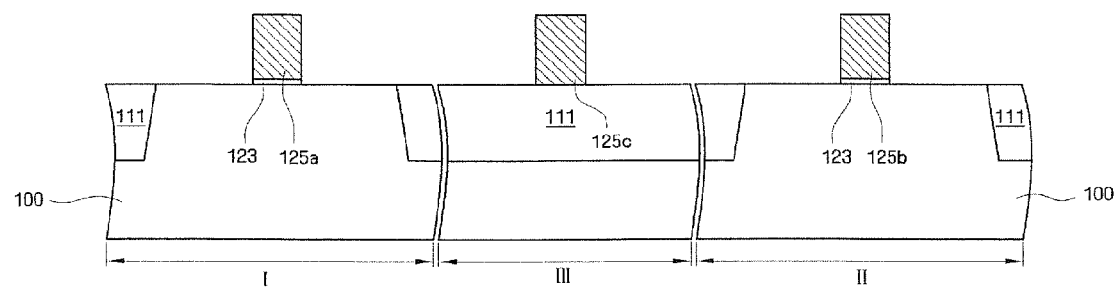

With reference to FIG. 6, an insulating substance and a conductive substance are applied to a front surface of the semiconductor substrate 100. The insulating substance layer may be, for example, a silicon oxide film. The application may be performed by a thermal oxidation process, chemical vapor deposition (CVD), low pressure chemical vapor deposition (LPCVD), or plasma enhanced chemical vapor deposition (PECVD).

The conductive substance may be, for example, polysilicon or metal into which n-type or p-type impurity is doped. The application may be performed by low pressure CVD (LPCVD), atomic layer deposition (ALD), physical vapor deposition (PVD), or metal organic CVD (MOCVD). Hereinafter, the case of when polysilicon is used as the conductive substance will be described.

The conductive substance layer and the insulating substance layer are patterned to form the gate electrodes 125*a*, 125*b*, and 125*c*, and the gate insulating film 123. Subsequently, the source/drain areas are formed in the active areas of the semiconductor substrate 100, and the silicide films are formed on the upper sides of the gate electrodes 125*a*, 125*b*, and 125*c* and the source/drain areas.

Figure 7:
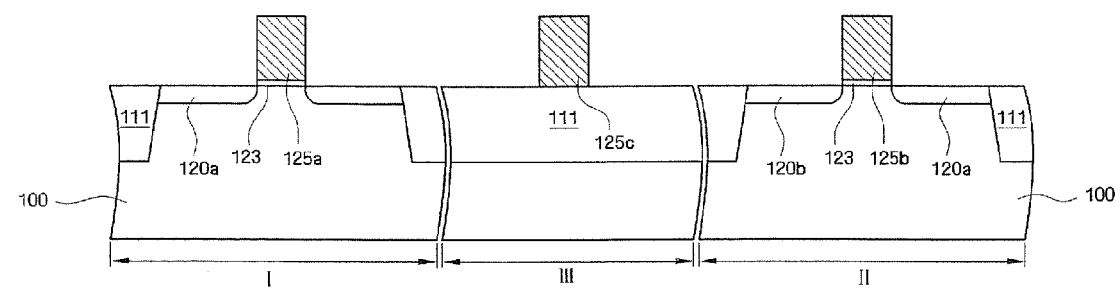

FIGS. 7 to 10 illustrate the formation of the source/drain areas and the silicide films. With reference to FIG. 7, the low concentration n-type impurity (see reference numeral 120*a*) is doped into the active area of the NMOS transistor area (I), and the low concentration p-type impurity (see reference numeral 120*b*) is doped into the active area of the PMOS transistor area (II). For example, when the low concentration n-type impurity is doped, a photoresist film covers the PMOS transistor area (II) to dope the n-type impurity into only the NMOS transistor area (I). When the low concentration p-type impurity is doped, the photoresist film covers the NMOS transistor area (II) to dope the p-type impurity into only the PMOS transistor area (I).

Figure 8:
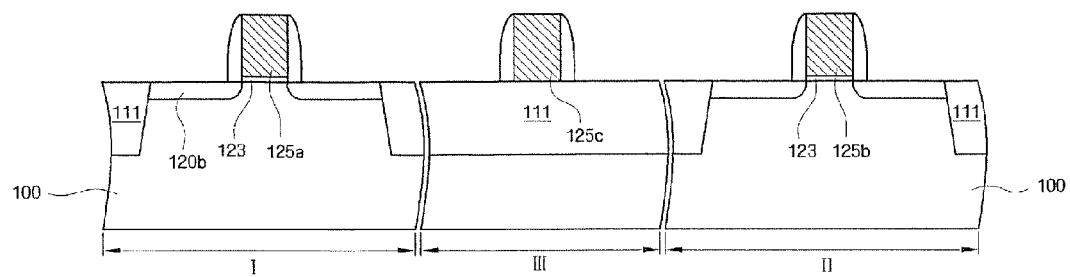

With reference to FIG. 8, the spacers 129 are formed on walls of the gate electrodes 125a, 125b, and 125c, and the gate insulating films 123. The spacers 129 may be formed of, for example, a silicon nitride film. The silicon nitride film may be layered on the semiconductor substrate 100 and an etch back process may be performed to form the spacers 129. In the drawing, the spacers 129 are arranged so that the upper side of the gate electrode is exposed and the upper sides of the spacers 129 are put on the same horizontal plane as the upper sides of the gate electrodes 125a, 125b, and 125c. Hereinafter, the above-mentioned structure will be described. However, the spacer 129 may be recessed so that the upper side of the spacer is lower than the upper sides of the gate electrodes 125a, 125b, and 125c in order to easily form the silicide film. Alternatively, the spacer 129 may be formed so as to cover the upper sides of the gate electrodes 125a, 125b, and 125c.

Figure 9:
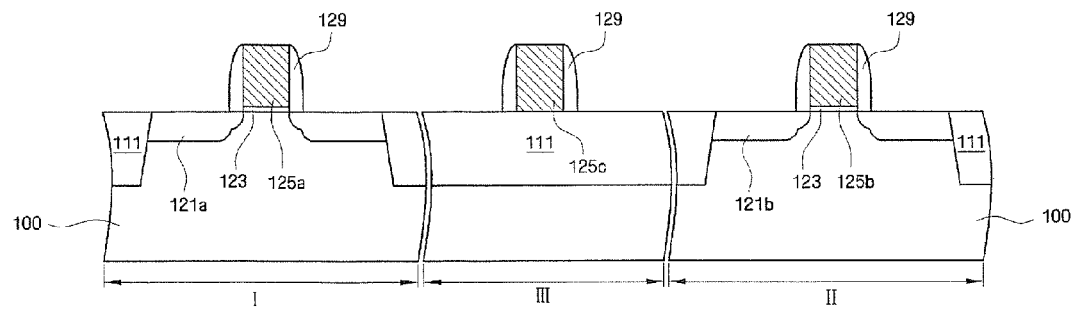

With reference to FIG. 9, the high concentration n-type impurity is doped into the active area of the NMOS transistor area (I), and the high concentration p-type impurity is doped into the active area of the PMOS transistor area (II). In detail, when the high concentration n-type impurity is doped, the photoresist film covers the PMOS transistor area (II) and the gate electrodes 125a, 125b, and 125c and the spacer 129, thereby doping the high concentration n-type impurity into only the exposed active area of the NMOS transistor area (I). Additionally, when the high concentration p-type impurity is doped, the photoresist film covers the NMOS transistor area (I) and the gate electrodes 125a, 125b, and 125c and the spacer 129, thereby doping the high concentration p-type impurity into only the PMOS transistor area (II). As a result, the source/drain areas 121a and 121b including the high concentration doping area and the low concentration doping area are formed.

Figure 10:
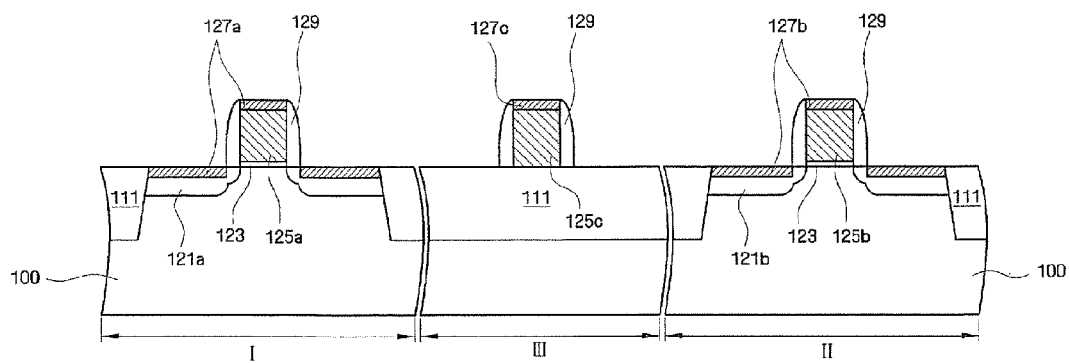

With reference to FIG. 10, the upper sides of the gate electrodes 125a, 125b, and 125c and the exposed upper sides of the source/drain areas 121a and 121b are subjected to silicidation. A metal film for silicidation, for example, metal such as tungsten (W), cobalt (Co), nickel (Ni), titanium (Ti), and tantalum (Ta), may be layered on the semiconductor substrate 100 and then subjected to heat treatment to perform the silicidation. For example, in the case of when the gate electrodes 125a, 125b, and 125c are formed of polysilicon, the upper sides of the source/drain areas 121a and 121b and the upper sides of the gate electrodes 125a, 125b, and 125c may be silicidated by the heat treatment of the semiconductor substrate 100. Subsequently, the metal film for silicidation that is not silicidated on the semiconductor substrate 100 may be removed to form the self-aligned silicide films 127a, 127b, and 127c on the upper sides of the gate electrodes 125a, 125b, and 125c and the exposed upper sides of the source/drain areas 121a and 121b.

Subsequently, the first stress film 131 is formed in the NMOS transistor area (I), and the second stress film 135 is formed in the PMOS transistor area (II). In connection with this, the first stress film 131 and the second stress film 135 are set to partially overlap each other in the interface area (III) in consideration of the process margin. More specific processes are shown in FIGS. 11 to 14.

Figure 11:
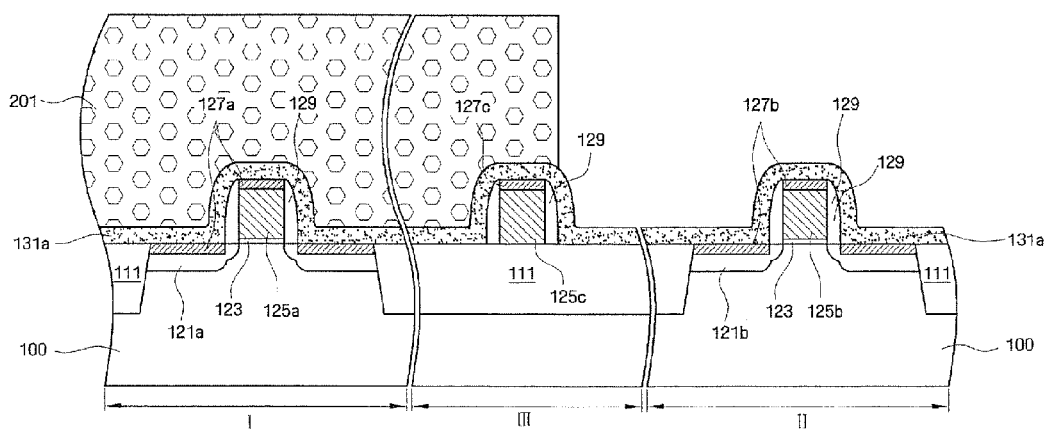

With reference to FIG. 11, a first stress film 131a is formed on the resulting structure of FIG. 10. The first stress film 131a may be, for example, a tensile stress film. The first stress film 131a may be formed of, for example, SiN, SiON, SiBN, SiC, SiC:H, SiCOH, SiCN, $SiO_2$, or a combination thereof. The first stress film 131a may have a thickness in the range of 1 to 1,000 Å, and may be formed by CVD (chemical vapor deposition), thermal CVD, PECVD (plasma enhanced CVD), or high density plasma CVD. For example, the first stress film 131a made of SiN may be formed by a silicon source gas such as $SiH_4$ and a nitrogen source gas such as $NH_3$ and $N_2$ at a temperature of 300 to 600° C. and a pressure of 1 to 10 torr. Tensile stress of the layered first stress film 131a may be controlled using a deposition condition or a composition ratio of substances constituting the film. For example, the stress may be controlled to the range of 0.01 to 5 GPa.

Subsequently, a first photoresist pattern 201 is formed on the first stress film 131a. The first photoresist pattern 201 covers the entire surface of the NMOS transistor area (I) while the PMOS transistor area (II) is exposed. Additionally, the first photoresist pattern 201 may be formed to cover a portion of the gate electrode 125c of the interface area (III), and preferably the entire gate electrode, so as to maintain the process margin, that is, to completely cover the entire NMOS transistor area (I).

Figure 12:
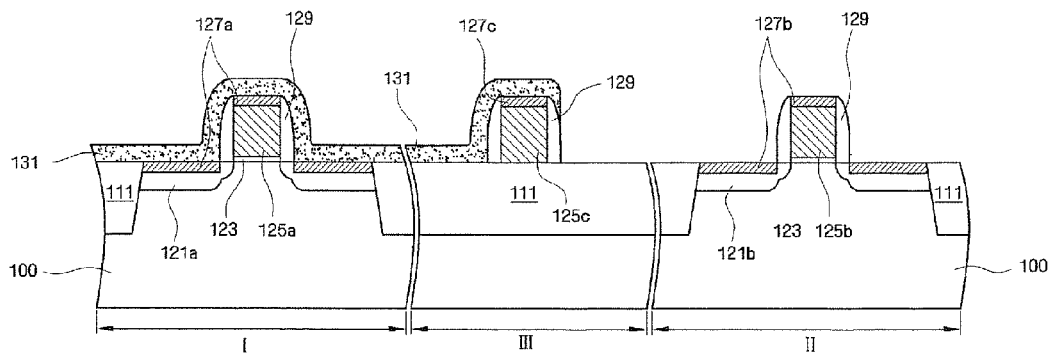

With reference to FIG. 12, the first stress film 131a is etched using the first photoresist pattern 201 as an etching mask. The etching may be performed using a dry etching process or a wet etching process. As shown in FIG. 12, the first stress film (see reference numeral 131) is formed in the NMOS transistor area (I) and the first stress film 131a is removed from the PMOS transistor area (II) resulting from the etching. The first stress film (see reference numeral 131) is formed in the interface area (III) so that the first stress film overlaps a portion of the gate electrode 125c. Subsequently, an ashing process or a strip process is performed to remove the first photoresist pattern 201.

Figure 13:
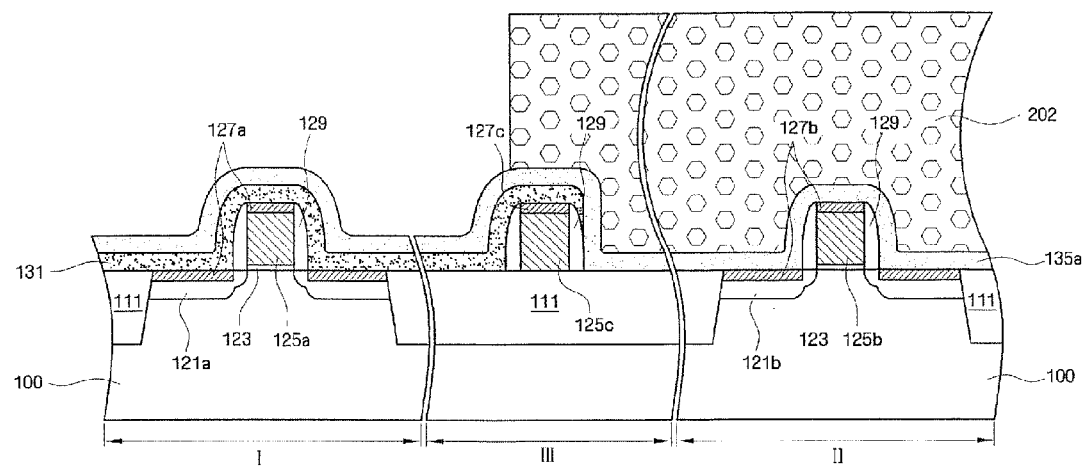

With reference to FIG. 13, a second stress film 135a is formed on the resulting structure of FIG. 12. The second stress film 135a may be, for example, a compressive stress film. The second stress film 135a may be formed of SiN, SiON, SiBN, SiC, SiC:H, SiCOH, SiCN, $SiO_2$, or a combination film thereof like the first stress film 131a. The process that is used to form the second stress film 135a may be the same as that of the first stress film 131a. However, the deposition condition of the second stress film 135a or a composition ratio of substances constituting the film are controlled so that the second stress film 135a has the stress different from that of the first stress film. For example, the compressive stress of the second stress film 135a may be 0.01 to −5 GPa. The second stress film 135a may have a thickness in the range of 1 to 1,000 Å. Preferably, the thickness of the second stress film 135a may be substantially the same as the thickness of the first stress film 131.

Subsequently, a second photoresist pattern 202 is formed on the second stress film 135a. The second photoresist pattern 202 covers the entire surface of the PMOS transistor area (II) while the NMOS transistor area (II) is exposed. Additionally, the second photoresist pattern 202 may be formed to cover a portion of the gate electrode 125c of the interface area (III), and preferably the entire gate electrode, so as to maintain the process margin and completely cover the entire PMOS transistor area (II).

Figure 14:
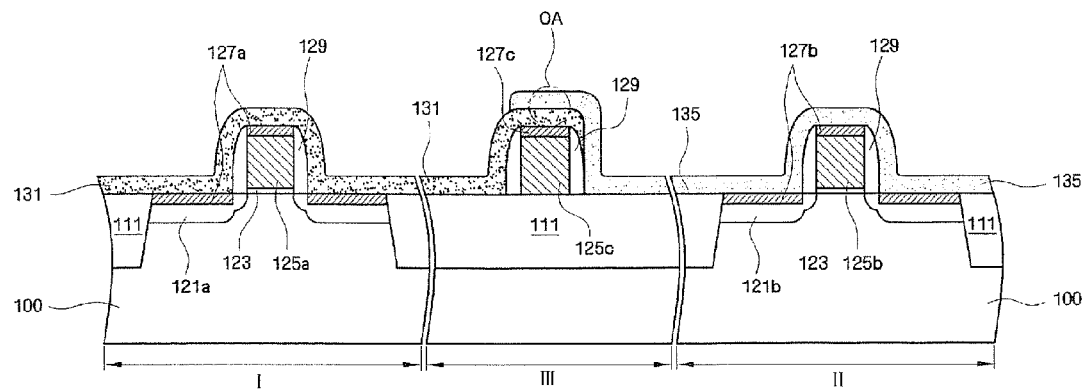

With reference to FIG. 14, the second stress film 135a is etched using the second photoresist pattern 202 as an etching mask. The etching of the second stress film 135a may be performed using a dry etching process or a wet etching process. As shown in FIG. 14, the second stress film (see reference numeral 135) is formed in the PMOS transistor area (II)

and the second stress film 135a is removed from the NMOS transistor area (I) resulting from the etching. The second stress film (see reference numeral 135) is formed in the interface area (III) so that the second stress film overlaps a portion of the gate electrode 125c. Accordingly, the interface area (III) may include an overlapping area (OA) where the first stress film 131 and the second stress film 135 are layered on the gate electrode 125c so as to overlap each other.

In connection with this, the area of the uppermost side of the overlapping area (OA) on the gate electrode 125c may be less than 10% of the total area of the semiconductor substrate 100. Additionally, the sum total of the areas of the first stress film 131, the second stress film 135, and the uppermost side of the overlapping area (OA) on the gate electrodes 125a and 125b of the NMOS transistor area (I) and the PMOS transistor area (II) may be 10 to 50% of the area of the semiconductor substrate 100. In the above-mentioned description, after the first stress film is formed, the second stress film is formed. However, the first stress film may be formed after the formation of the second stress film.

Figure 15:
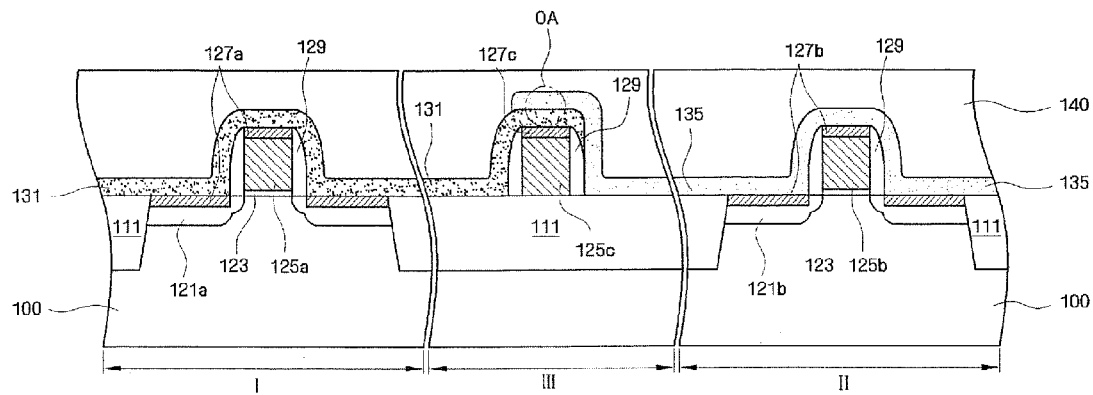

With reference to FIG. 15, a first interlayer insulating film 140 is formed on the resulting structure of FIG. 14. The first interlayer insulating film 140 may be formed of, for example, TEOS (tetra ethyl ortho silicate), $O_3$-TEOS, $SiO_2$, SiON, SiOC, or a combination thereof. For example, the formation may be performed using a process such as CVD.

The first interlayer insulating film 140 is formed to cover the uppermost side of the resulting structure of FIG. 14, for example, the entire overlapping area (OA) of the first and the second films 131 and 135 provided on the gate electrode 121c in the interface area (III). In consideration of the process margin, the first interlayer insulating film 140 may be formed to have, for example, a thickness in the range of 100 to 500 Å from the upper side of the overlapping area (OA).

Figure 16:
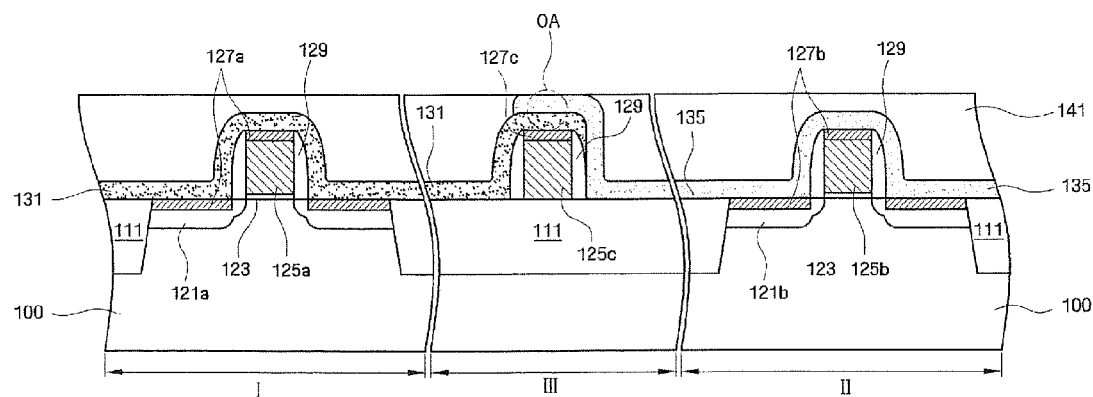

With reference to FIG. 16, the first interlayer insulating film 140 is planarized by using a CMP (chemical mechanical polishing) process. The CMP process may be performed using a slurry. Examples of the slurry include, but are not limited to ceria and a ceria fixed abrasive. However, it is required that the polishing rate of the slurry to the first interlayer insulating film is higher than that of the slurry to the first stress film 131. The polishing selectivity may be preferably 10:1 or more, and more preferably 20:1 or more. Additionally, for example, the CMP process may be performed at a pressure of 0.5 to 3 psi.

However, the level of the first interlayer insulating film 140 is lowered as the planarization of the first interlayer insulating film 140 is performed to expose the upper side of the second stress film 135 in the overlapping area (OA) of the interface area (III) that is the uppermost side of the lower structure. In connection with this, even though a difference in polishing selectivity of the first interlayer insulating film 141 and the second stress film 135 is large because the polishing selectivities of the slurry which is used in the CMP process to the first stress film 131 and the second stress film 135 are similar to each other, when the exposed area is less than 10% of the entire area of the semiconductor substrate 100, the planarization is not stopped, and the polishing is performed at the polishing rate that is similar to that of the 1 interlayer insulating film 141. That is, the exposed second stress film 135 does not act as a polishing stopper.

Figure 17:
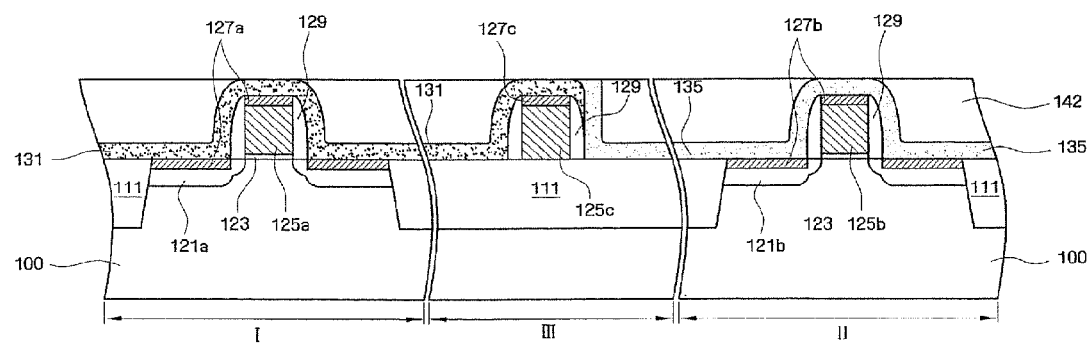

With reference to FIG. 17, the first interlayer insulating film 141 and the exposed second stress film 135 are polished according to steady progress of the CMP process so as to expose the first stress film 131 and the second stress film 135 that are provided on the upper sides of the gate electrodes 125a and 125b in the NMOS transistor area (I) and the PMOS transistor area (II) to constitute the uppermost layer of the lower structure. Additionally, the second stress film 135 is removed from the overlapping area (OA) of the interface area (III), and the first stress film 131 that has the same level as the uppermost layers of other regions is exposed.

However, as described above, the total area of the exposed first stress film 131 of the NMOS transistor area (I) and the interface area (III) and the exposed second stress film 135 of the PMOS transistor area (II) is in the range of from 10 to 50%. In connection with this, if the CMP process is performed at a pressure of 0.5 to 3 psi, the planarization cannot further progress due to the first and the second stress films 131 and 135 having the high polishing selectivity. In other words, the exposed first and second stress films 131 and 135 act as the polishing stopper.

If the planarization does not further progress due to the exposure of the first stress film 131 of the NMOS transistor area (I) and the interface area (III) and the second stress film 135 of the PMOS transistor area (II), the CMP process is stopped. In connection with this, as described above, the first stress film 131 and the second stress film 135 act as the polishing stopper, thus the desirable process margin may be assured.

Figure 18:
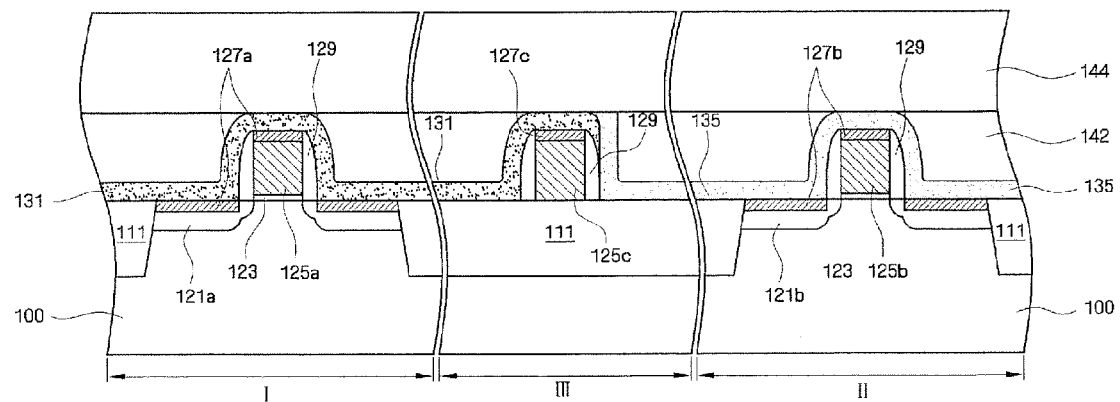

With reference to FIG. 18, a second interlayer insulating film 144 is formed on the first interlayer insulating film 142. The second interlayer insulating film 144 may be formed of, for example, TEOS (tetra ethyl ortho silicate), $O_3$-TEOS, $SiO_2$, SiON, SiOC, or a combination thereof. The second interlayer insulating film 144 may be made of the substance that is the same as the first interlayer insulating film 142 or different from the first interlayer insulating film 142.

Figure 19:
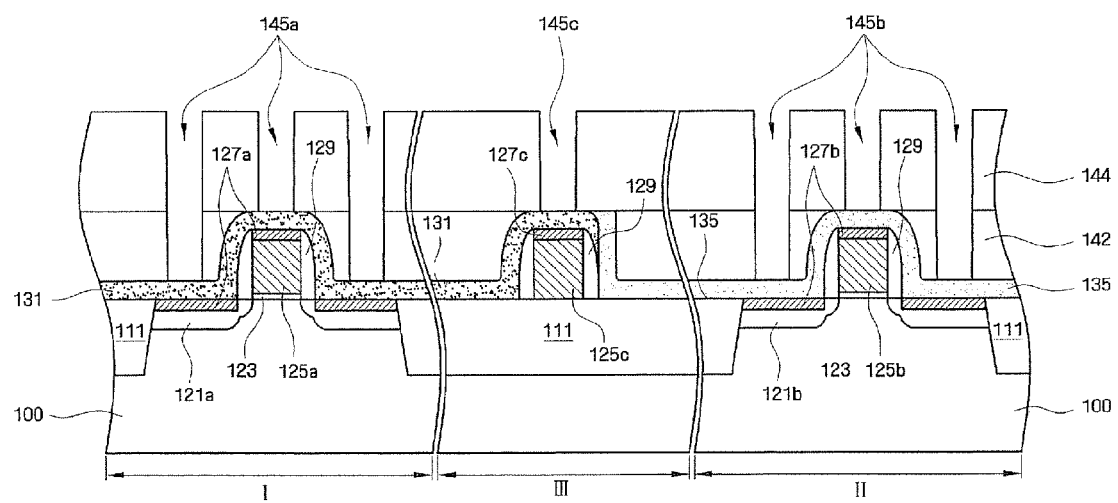

With reference to FIG. 19, the second interlayer insulating film 144 and the first interlayer insulating film 142 are patterned to form preliminary contact holes 145a, 145b, and 145c in the NMOS transistor area (I), the PMOS transistor area (II), and the interface area (III). The preliminary contact holes 145a, 145b, and 145c are formed to correspond to the gate electrodes 125a, 125b, and 125c in the regions and/or the source/drain areas 121a and 121b so that the first stress film 131 or the second stress film 135 are exposed therethrough. In detail, the preliminary contact holes 145a, 145b, and 145c are formed so that the first stress film 131 is exposed through the preliminary contact holes 145a and 145c of the NMOS transistor area (I) and the interface area (III), and the second stress film 135 is exposed through the preliminary contact hole 145b of the PMOS transistor area (II).

The first and the second interlayer insulating films 142 and 144 may be patterned by a photolithography process using a photoresist pattern. The etching may be performed using a dry etching process or a wet etching process. Preferably, a dry etching may be used. In the event the etching gas or an etchant in which the etching selectivity to the second interlayer insulating film 144 and the first interlayer insulating film 142 is higher than the etching selectivity to the first stress film 131 and the second stress film 135 is used, the first stress film 131 and the second stress film 135 may act as the process stopper during the etching of the interlayer insulating film 140. In connection with this, the exposed first and second stress films 131 and 135 have substantially the same thickness.

Figure 20:
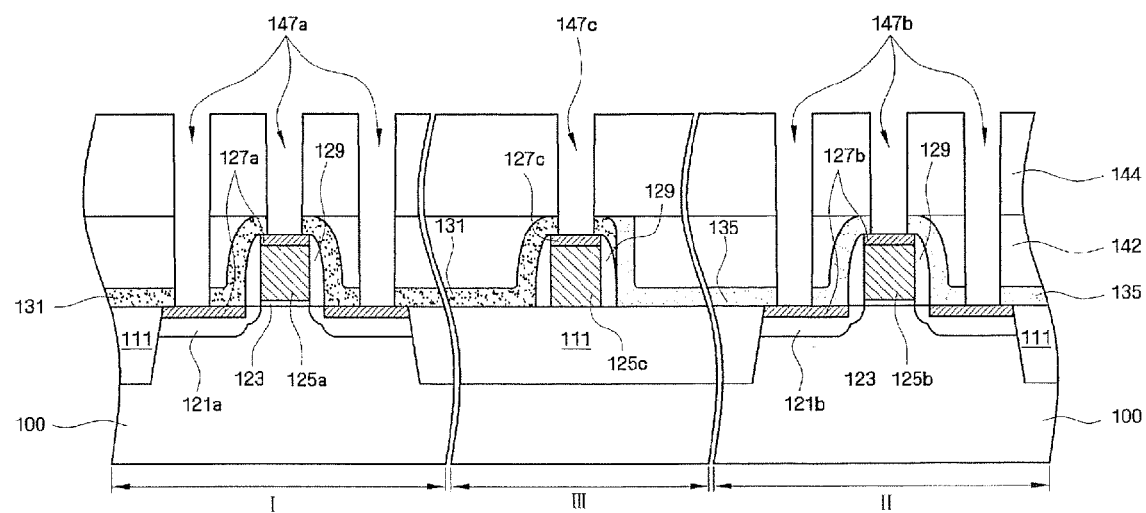

With reference to FIG. 20, the first stress film 131 and the second stress film 135 which are exposed through the preliminary contact holes 145a, 145b, and 145c are etched to form the contact holes 147a, 147b, and 147c through which the gate electrodes 125a, 125b, and 125c and the source/drain areas 121a and 121b are exposed. Since the etching thicknesses of the first stress film 131 and the second stress film 135 are substantially the same as in all the regions, the contact holes 147a, 147b, and 147c may be formed almost simultaneously. That is to say, in the present embodiment, it is unnecessary to additionally overetch the contact holes that are already formed in order to form all the contact holes 147a, 147b, and 147c of the regions. Thus, it is possible to prevent the gate electrodes 125a, 125b, and 125c and/or the source/drain areas 121a and 121b from being attacked. Particularly, it is possible to prevent the silicide films 127a, 127b, and 127c on the upper sides of the gate electrodes 125a, 125b, and 125c and the source/drain areas 121a and 121b from being attacked or removed. Accordingly, the contact characteristic is improved.

Turning to FIG. 1, the contact plugs 171, 173, and 175 are formed in the contact hole 147a, 147b, and 147c. The contact plugs 171, 173, and 175 are made of a metal substance such as W, Cu, or Al, or a conductive substance such as conductive polysilicon. The contact plugs 171, 173, and 175 may be formed by means of the above-mentioned substance by low pressure CVD (LPCVD), atomic layer deposition (ALD), physical vapor deposition (PVD), metal organic CVD (MOCVD), electrolytic plating, or electroless plating. If necessary, the planarization process such as CMP (chemical mechanical polishing) or etchback may be performed until the surface of the interlayer insulating film 140 is exposed, thereby fabricating the semiconductor device shown in FIG. 1.

Figure 21:
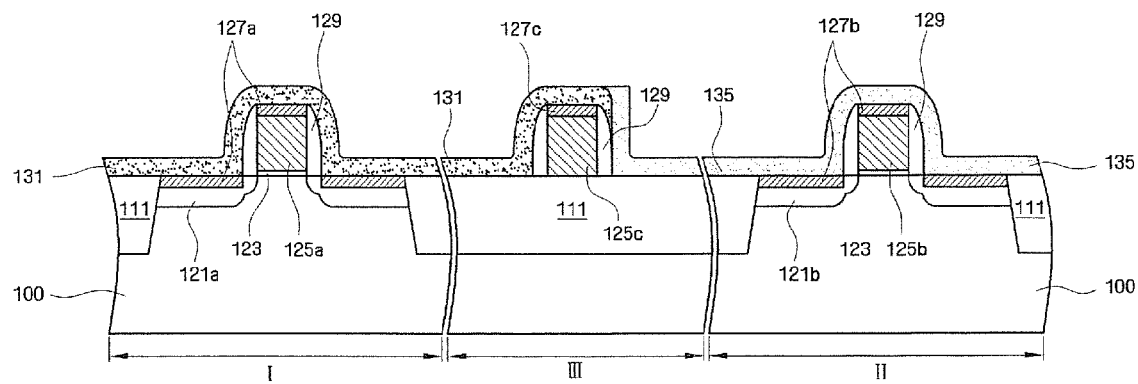
FIGS. 21 and 22 are sectional views illustrating the fabrication of the semiconductor device according to the embodiment of the present invention shown in FIG. 2.
Figure 22:
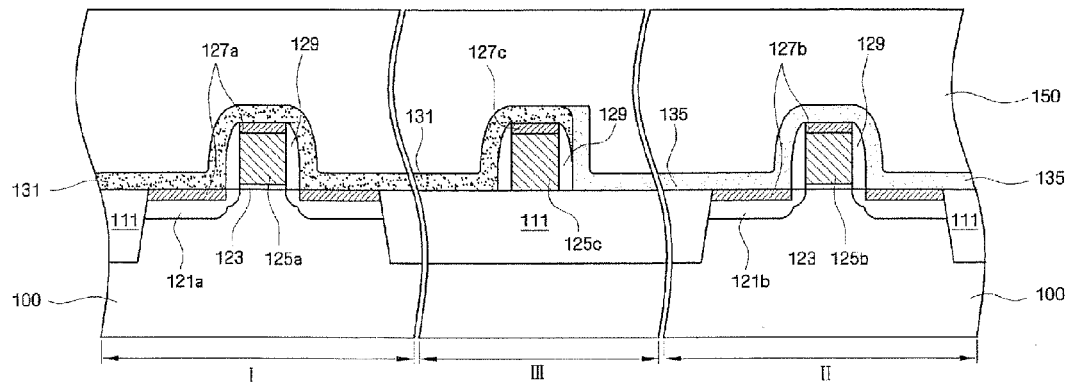

FIGS. 21 and 22 are sectional views of intermediate structures at steps of the method of fabricating the semiconductor device according to the second embodiment of the present invention shown in FIG. 2.

The method of fabricating the semiconductor device according to the present embodiment is the same as that of the first embodiment of the present invention shown in FIGS. 5 to 17 until the step of performing the CMP process. With reference to FIG. 21, the first interlayer insulating film (reference numeral 142 of FIG. 17) is completely removed. The removal of the first interlayer insulating film (reference numeral 142 of FIG. 17) may be performed by, for example, wet etching, dry etching, or etchback.

With reference to FIG. 22, a third interlayer insulating film 150 is formed on the resulting structure of FIG. 21. The third interlayer insulating film 150 may be formed to have substantially the same thickness as the total thickness of the first interlayer insulating film and the second interlayer insulating film of FIG. 18. Since subsequent processes are substantially the same as those of the first embodiment of the present invention shown in FIGS. 19, 20, and 1, the description thereof will be omitted.

Figure 23:
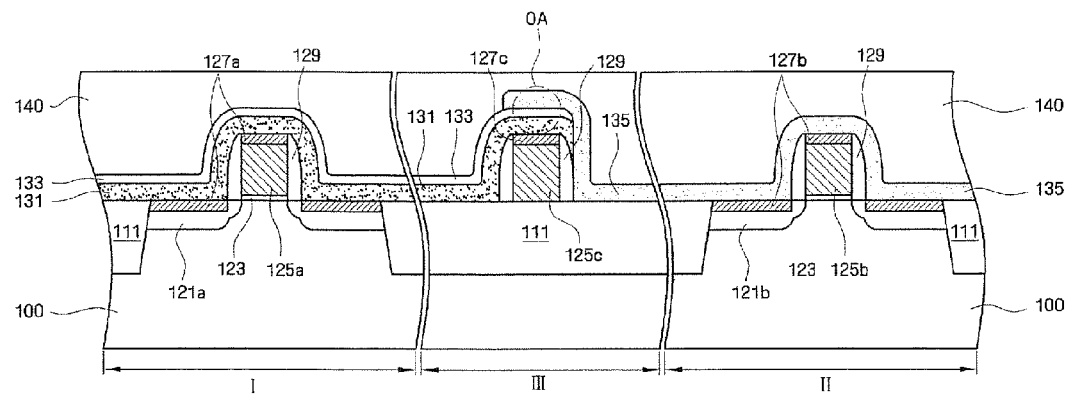
FIGS. 23 and 24 are sectional views illustrating the fabrication of the semiconductor device according to the embodiment of the present invention shown in FIG. 3.
Figure 24:
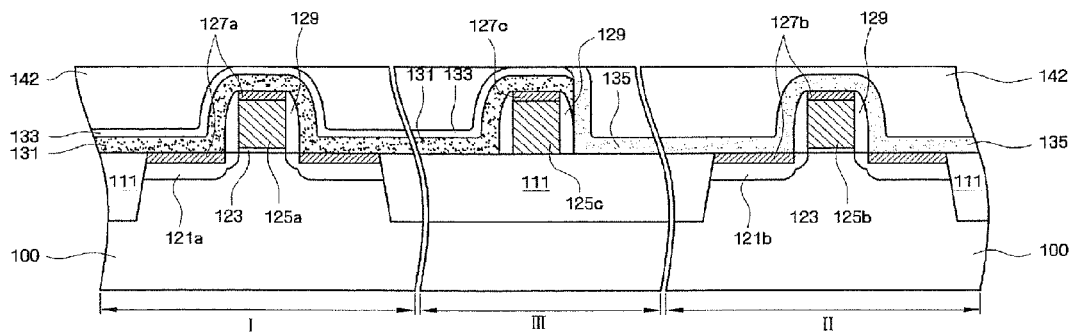

FIGS. 23 and 24 are sectional views of intermediate structures that illustrate methods of fabricating the semiconductor device according to third embodiments of the present invention shown in FIG. 3. The method of fabricating the semiconductor device according to the present embodiment is almost the same as that of the first embodiment of the present invention shown in FIGS. 5 to 14 until the step of the formation of the second stress film. However, in FIG. 23, the method according to the present embodiment is different from that of the first embodiment of the present invention in that the etch stop film 133 is formed after the formation of the first stress film 131 and the total area of the uppermost surface of the overlapping area (OA) of the NMOS transistor area (I) and the interface area (III) is 10 to 50% of the area of the semiconductor substrate 100 after the formation of the second stress film 135. In connection with this, the area of the uppermost surface of the overlapping area (OA) on the gate electrode 125c may be less than 10% of the total area of the semiconductor substrate 100. The first interlayer insulating film 140 is formed on the semiconductor substrate 100 on which the first stress film 131 and the second stress film 135 are formed like the first embodiment.

With reference to FIG. 24, the first interlayer insulating film 140 is planarized by the CMP (chemical mechanical polishing) process. The CMP process is performed at the same condition as the above-mentioned embodiment of FIG. 16. The level of the first interlayer insulating film 140 is lowered as the first interlayer insulating film 140 is planarized to expose the overlapping area (OA) having the uppermost level of the lower structure. Since the exposed area is less than 10% of the total area of the semiconductor substrate 100, the second stress film 135 of the exposed region is polished along with the first interlayer insulating film 140 as shown in FIG. 16.

The first interlayer insulating film 140 and the exposed second stress film 135 are polished by performing of the CMP process to expose the etch stop film 133 which is provided on the upper sides of the gate electrodes 125a and 125b of the NMOS transistor area (I) and constitutes the uppermost layer of the lower structure. Additionally, the second stress film 135 is removed from the overlapping area (OA) of the interface area (III) to expose the etch stop film 133. However, since the second stress film 135 of the PMOS transistor area (II) has the level lower than those of the uppermost layers of the other regions, the second stress film is not exposed at this step.

However, as described above, since the total area of the uppermost surface of the overlapping area (OA) of the NMOS transistor area (I) and the interface area (III) other than the PMOS transistor area (II) is 10 to 50% of the area of the semiconductor substrate 100 in the present embodiment, the planarization does not further progress in the case of when the etch stop film 133 has low polishing selectivity. That is, the exposed etch stop film 133 acts as the polishing stopper.

The CMP process is stopped at the above-mentioned step, and the subsequent processes are performed using the same method as the first embodiment of the present invention shown in FIGS. 18 to 20 and FIG. 1, thereby fabricating the semiconductor device of FIG. 3.

Meanwhile, the first interlayer insulating film 142 having substantially the same thickness as the etch stop film 133 is formed on the gate electrode 125b of the interlayer insulating film of the PMOS transistor area (II). If the patterning is performed using the etching gas or the etchant where the etching selectivity to the first interlayer insulating film 142 is the same as the etching selectivity to the etch stop film 133 during the formation of the preliminary contact holes, it is possible to prevent damage to the lower structure. Particularly, in the case where both the first interlayer insulating film 142 and the etch stop film 133 are made of an oxide film, it is easy to make the etching selectivities be made identical.

Figure 25:
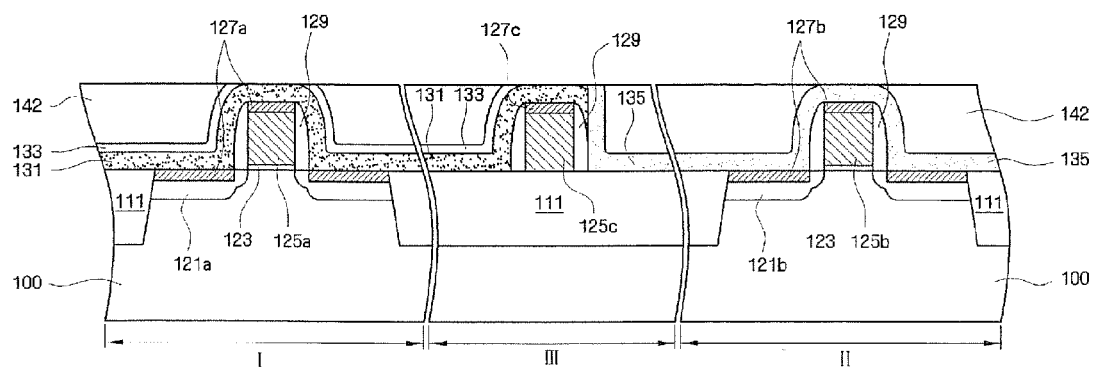
FIG. 25 is a sectional view illustrating the fabrication of the semiconductor device according to the embodiment of the present invention shown in FIG. 4.

FIG. 25 is a sectional view illustrating the fabrication of a semiconductor device according to a fourth embodiment of the present invention shown in FIG. 4. With reference to FIG. 25, the method of fabricating the semiconductor device according to the present embodiment is different from that of the third embodiment of the present invention in that the total area of the uppermost surface of the overlapping area (OA) of the NMOS transistor area (I) and the interface area (III) is less than 10% of the area of the semiconductor substrate 100, and the total area of the overlapping area (OA) of the NMOS transistor area (I), the PMOS transistor area (II), and the interface area (III) is 10 to 50% of the area of the semiconductor substrate 100. Accordingly, the planarization is not stopped when the etch stop film 133 of the NMOS transistor area (I) and the interface area (III) is exposed, but may be stopped at the same time the first stress film 131 and the second stress film 135 of the PMOS transistor area (II) are exposed. Since other steps are substantially the same as those of the third embodiment of the present invention, the description thereof will be omitted.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method of forming an integrated circuit device, comprising:
    forming first, second and third gate electrodes on a semiconductor substrate;
    forming a first stress film that covers the first gate electrode and at least a first portion of the third gate electrode, said first stress film having a sufficiently high internal stress characteristic to impart a net compressive stress in a first portion of the semiconductor substrate extending opposite the first gate electrode;
    forming an etch stop film that conforms to the first stress film and contacts a portion of the first stress film extending opposite a sidewall of the third gate electrode; and
    forming a second stress film that covers the second gate electrode and at least a second portion of the third gate electrode, said second stress film having a sufficiently high internal stress characteristic to impart a net tensile stress in a second portion of the semiconductor substrate extending opposite the second gate electrode and having an upper surface that is coplanar with an upper surface of the first stress film at a location adjacent the third gate electrode.

2. A method of fabricating a semiconductor device, the method comprising:
    forming a first stress film covering a first gate electrode and first source/drain areas of a first transistor area of a semiconductor substrate, and at least a portion of a third gate electrode of an interface area between the first transistor area and a second transistor area;
    forming an etch stop film that conforms to the first stress film and contacts a portion of the first stress film extending opposite a sidewall of the third gate electrode; and
    forming a second stress film covering a second gate electrode and second source/drain areas of the second transistor area of the semiconductor substrate and overlapping at least a portion of the first stress film on the third gate electrode of the interface area;
    forming a first interlayer insulating film on the semiconductor substrate; and
    planarizing the first interlayer insulating film by using CMP to expose upper sides of the first stress film on the first gate electrode, the second stress film on the second gate electrode, and the first stress film on the third gate electrode.

3. A method of fabricating a semiconductor device, the method comprising:
    forming a first stress film covering a first gate electrode and first source/drain areas of a first transistor area of a semiconductor substrate and at least a portion of a third gate electrode of an interface area between the first transistor area and a second transistor area;
    forming an etch stop film that conforms to the first stress film and contacts a portion of the first stress film extending opposite a sidewall of the third gate electrode;
    forming a second stress film covering a second gate electrode and second source/drain areas of a second transistor area of the semiconductor substrate and overlapping at least a portion of the etch stop film on the third gate electrode of the interface area;
    forming a first interlayer insulating film on the semiconductor substrate; and
    planarizing the first interlayer insulating film by using CMP to expose upper sides of the etch stop film on the first gate electrode and the etch stop film on the third gate electrode.

4. The method of claim 1, wherein the etch stop film has an upper surface that is coplanar with the upper surface of said second stress film.

5. The method of claim 4, wherein the upper surface of the etch stop film is also coplanar with the upper surface of said first stress film.

6. The method of claim 5, further comprising forming an interlayer insulating film on said second stress film.

7. The method of claim 6, wherein a primary surface of the interlayer insulating film is coplanar with the upper surfaces of said first and second stress films and the upper surface of the etch stop film.

8. The method of claim 1, wherein said first and second stress films comprise equivalent materials.

9. The method of claim 2, wherein:
    an area of the second stress film overlapping the first stress film on the third gate electrode is 10% or less of an area of the semiconductor substrate; and
    a sum total of areas of the upper sides of the first stress film on the first gate electrode, the second stress film on the second gate electrode, and the first stress film on the third gate electrode which are exposed due to the planarizing of the first interlayer insulating film is 10 to 50% of the area of the semiconductor substrate.

10. The method of claim 9, wherein CMP is performed at a pressure of 0.5 to 3 psi.

11. The method of claim 2, further comprising:
    forming a second interlayer insulating film on the first interlayer insulating film after the first interlayer insulating film is planarized; and
    forming a plurality of contact holes through which the first, the second, and the third gate electrodes and the first and the second source/drain areas are exposed.

12. The method of claim 2, further comprising:
    removing the first interlayer insulating film after the first interlayer insulating film is planarized;
    forming a third interlayer insulating film on a resulting structure; and
    forming a plurality of contact holes through which the first, the second, and the third gate electrodes and the first and the second source/drain areas are exposed.

13. The method of claim 2, wherein the first stress film and the second stress film are formed of SiN, SiON, SiBN, SiC, SiC:H, SiCOH, SiCN, $SiO_2$, or a combination thereof.

14. The method of claim 2, wherein:
    the first transistor is an NMOS transistor;
    the second transistor is a PMOS transistor;
    the first stress film has tensile stress of 0.01 to 5 GPa; and
    the second stress film has compressive stress of −0.01 to −5 GPa.

15. The method of claim 3, wherein:
    an area of the second stress film overlapping the etch stop film on the third gate electrode is 10% or less of an area of the semiconductor substrate;
    a sum total of areas of the upper sides of the etch stop film on the first gate electrode and the etch stop film on the third gate electrode which are exposed due to the planarizing of the first interlayer insulating film is 10 to 50% of the area of the semiconductor substrate, and the CMP is performed at a pressure of 0.5 to 3 psi.

16. The method of claim 15, further comprising:
forming a second interlayer insulating film on the first interlayer insulating film after the first interlayer insulating film is planarized; and
forming a plurality of contact holes through which the first, the second, and the third gate electrodes and first and second source/drain areas are exposed.

17. The method of claim 15, further comprising:
removing the first interlayer insulating film after the first interlayer insulating film is planarized;
forming a third interlayer insulating film on a resulting structure; and
forming a plurality of contact holes through which the first, the second, and the third gate electrodes and first and second source/drain areas are exposed.

* * * * *